US012571827B2

(12) United States Patent
Wang et al.

(10) Patent No.: US 12,571,827 B2
(45) Date of Patent: Mar. 10, 2026

(54) POWER MEASUREMENT CIRCUIT, CHIP AND COMMUNICATION TERMINAL

(71) Applicant: SHANGHAI VANCHIP TECHNOLOGIES CO., LTD., Shanghai (CN)

(72) Inventors: Yongshou Wang, Shanghai (CN); Chunling Li, Shanghai (CN); Cheng Chen, Shanghai (CN); Chenyang Gao, Shanghai (CN)

(73) Assignee: SHANGHAI VANCHIP TECHNOLOGIES CO., LTD., Shanghai (CN)

( * ) Notice: Subject to any disclaimer, the term of this patent is extended or adjusted under 35 U.S.C. 154(b) by 143 days.

(21) Appl. No.: 18/401,493

(22) Filed: Dec. 31, 2023

(65) Prior Publication Data

US 2024/0142506 A1 May 2, 2024

Related U.S. Application Data

(63) Continuation of application No. PCT/CN2022/103463, filed on Jul. 1, 2022.

(30) Foreign Application Priority Data

Jul. 2, 2021 (CN) .......................... 202110753543.0

(51) Int. Cl.
G01R 29/08 (2006.01)
(52) U.S. Cl.
CPC ................................ G01R 29/0892 (2013.01)

(58) Field of Classification Search
CPC .... G01R 29/0892; G01R 21/01; G01R 21/14; G05F 1/567
USPC .......................................................... 324/637
See application file for complete search history.

(56) References Cited

U.S. PATENT DOCUMENTS 3,886,435 A * 5/1975 Steckler .................. G05F 3/265
                                                    327/535
5,640,085 A * 6/1997 Petr ......................... G01R 19/32
                                                    324/105
6,111,739 A * 8/2000 Wu ......................... H05B 45/56
                                                    315/225
6,222,470 B1 * 4/2001 Schuelke .................. G05F 3/30
                                                    341/119
6,791,313 B2 * 9/2004 Ohtsuka ............... H10N 52/101
                                                    257/E43.003

(Continued)

*Primary Examiner* — Christopher P Mcandrew
(74) *Attorney, Agent, or Firm* — George Guosheng Wang; Upstream Research and Patent LLC

(57) ABSTRACT

A power measurement circuit, a chip and a communication terminal. The power measurement circuit comprises a power measurement unit (100), a reference current generation unit (200), a voltage-current conversion unit (300) and an operation output unit (400), wherein an output end of the power measurement unit (100) is connected to an input end of the voltage-current conversion unit (300), and an output end of the voltage-current conversion unit (300) and an output end of the reference current generation unit (200) are respectively connected to an input end of the operation output unit (400). By means of the circuit, during the process of a power measurement unit (100) converting, into a direct-current voltage, a received radio frequency signal to be measured, sensitivity adjustment is performed, such that the measurement sensitivity can be effectively adjusted.

9 Claims, 3 Drawing Sheets

(56) References Cited

U.S. PATENT DOCUMENTS

| | | | | |
|---|---|---|---|---|
| 7,224,158 | B2 * | 5/2007 | Petr ........................ | G01R 33/02 |
| | | | | 324/117 R |
| 7,805,262 | B2 * | 9/2010 | Slater .................... | G01K 13/00 |
| | | | | 702/61 |
| 8,094,033 | B2 * | 1/2012 | Dauphinee .......... | H03G 3/3036 |
| | | | | 324/105 |
| 2016/0178675 | A1 * | 6/2016 | Eplett ................... | G01R 21/00 |
| | | | | 324/119 |

* cited by examiner

POWER MEASUREMENT CIRCUIT, CHIP
AND COMMUNICATION TERMINAL

BACKGROUND

Technical Field

The present invention relates to a power measurement circuit, also relates to an integrated circuit chip and a corresponding communication terminal that include the power measurement circuit, and relates to the field of integrated circuit technologies.

Related Art

With the continuous improvement of an integrity of a communication system, a new requirement and challenge are put forward for a performance requirement of a radio frequency front-end chip. Especially in a radio frequency transmission system, a high-performance and high-power power amplifier needs to measure transmission power output by a power amplifier to obtain an excellent radio frequency performance and improve reliability of the entire system.

SUMMARY

A primary technical problem to be resolved in the present invention is to provide a power measurement circuit.

Another technical problem to be resolved in the present invention is to provide a chip and a communication terminal that include the power measurement circuit.

To achieve the foregoing objectives, the following technical solutions are used in the present invention:

According to a first aspect of an embodiment of the present invention, a power measurement circuit is provided, including a power measurement unit, a reference current generation unit, a voltage-current conversion unit, and an operation output unit. An output end of the power measurement unit is connected to an input end of the voltage-current conversion unit, and output ends of the voltage-current conversion unit and the reference current generation unit are connected to an input end of the operation output unit.

A received radio frequency signal to be measured is sequentially calibrated and filtered by using the power measurement unit, to obtain a direct current voltage signal with a corresponding temperature coefficient. The direct current voltage signal is output to the voltage-current conversion unit, to obtain a corresponding direct current. The corresponding direct current is output to the operation output unit. The reference current generation unit generates reference currents with different temperature coefficients, selects, from the reference currents, a reference current with a same temperature coefficient as the direct current, and outputs the reference current to the operation output unit to perform, according to a preset ratio, a superposition operation on the reference current and the corresponding direct current, to obtain an output current irrelevant to a temperature and convert the output current into a corresponding output voltage.

Preferably, the power measurement unit includes a measurement subunit, a measurement sensitivity adjustment subunit, and a low-pass filtering subunit. An input end of the measurement subunit is connected to the to-be-measured radio frequency signal. An adjustment end of the measurement subunit is connected to a common end of the measurement sensitivity adjustment subunit. An output end of the measurement subunit is connected to an input end of the low-pass filtering subunit. An input end of the measurement sensitivity adjustment subunit is connected to an external bandgap reference circuit. An output end of the low-pass filtering subunit is connected to the input end of the voltage-current conversion unit.

Preferably, the power measurement unit includes a first capacitor, a first NMOS transistor, and a first PMOS transistor. One end of the first capacitor is connected to the to-be-measured radio frequency signal, and the other end of the first capacitor is connected to a gate of the first NMOS transistor. The gate and a drain of the first NMOS transistor are connected to each other and are connected to a drain of the first PMOS transistor, the common end of the measurement sensitivity adjustment subunit, and the input end of the low-pass filtering subunit. A source of the first NMOS transistor is grounded.

Preferably, the measurement sensitivity adjustment subunit includes a current source, a second PMOS transistor, and a plurality of third PMOS transistors and change-over switches. The current source is connected to a drain and a gate of the second PMOS transistor and gates of the third PMOS transistors. A gate of the second PMOS transistor is connected to a gate of the first PMOS transistor. Drains of the third PMOS transistors are respectively connected to movable ends of corresponding change-over switches. Stationary ends of the change-over switches are jointly connected to a node between the drains of the first PMOS transistor and the first NMOS transistor to form the common end of the measurement sensitivity adjustment subunit. Sources of the second PMOS transistor and the third PMOS transistors are connected to a power supply voltage.

Preferably, the reference current generation unit includes a reference voltage generation subunit, a voltage temperature coefficient adjustment subunit, and a voltage-current conversion subunit. An output end of the reference voltage generation subunit is connected to an input end of the voltage temperature coefficient adjustment subunit. An output end of the voltage temperature coefficient adjustment subunit is connected to an input end of the voltage-current conversion subunit. An output end of the voltage-current conversion subunit is connected to the input end of the operation output unit.

Preferably, the voltage temperature coefficient adjustment subunit includes a same quantity of fifth resistors and control switches. The fifth resistors are sequentially connected in series. Resistance feedback nodes are respectively provided between adjacent fifth resistors as well as between a last fifth resistor and a drain of a fourth PMOS transistor of the reference voltage generation subunit. The resistance feedback nodes are respectively connected to movable ends of the control switches, and stationary ends of the control switches are connected to the input end of the voltage-current conversion subunit.

Preferably, the voltage-current conversion unit includes a second operational amplifier, a second NMOS transistor, a sixth PMOS transistor, a seventh PMOS transistor, and a sixth resistor. A non-inverting input end of the second operational amplifier is connected to the output end of the power measurement unit.

Alternatively, the voltage-current conversion subunit includes a second operational amplifier, a second NMOS transistor, a sixth PMOS transistor, a seventh PMOS transistor, and a sixth resistor. The non-inverting input end of the second operational amplifier is connected to the output end of the voltage temperature coefficient adjustment subunit. An inverting input end of the second operational amplifier is connected to one end of the sixth resistor and a source of the second NMOS transistor. An output end of the second operational amplifier is connected to a gate of the second NMOS transistor. A drain of the second NMOS transistor is connected to a drain and gate of the sixth PMOS transistor as well as a gate of the seventh PMOS transistor. Sources of the sixth PMOS transistor and the seventh PMOS transistor are connected to a power supply voltage. A drain of the seventh PMOS transistor is connected to the input end of the operation output unit.

Preferably, the operation output unit includes an operation subunit and a current-voltage conversion subunit, an input end of the operation subunit is connected to the output ends of the voltage-current conversion unit and the reference current generation unit, and an output end of the operation subunit is connected to an input end of the current-voltage conversion subunit.

Preferably, the operation subunit includes a third NMOS transistor, a fourth NMOS transistor, a fifth NMOS transistor, a sixth NMOS transistor, an eighth PMOS transistor, a tenth PMOS transistor, a seventh resistor, and an eighth resistor. One end of the seventh resistor is connected to the output end of the reference current generation unit and gates of the third NMOS transistor and the fourth NMOS transistor. The other end of the seventh resistor is connected to a drain of the third NMOS transistor and gates of the fifth NMOS transistor and the sixth NMOS transistor. A source of the third NMOS transistor is connected to a drain of the fifth NMOS transistor. One end of the eighth resistor is connected to the output end of the voltage-current conversion unit, a drain of the eighth PMOS transistor, and a gate of the tenth PMOS transistor. The other end of the eighth resistor is connected to a drain of the fourth NMOS transistor and a gate of the eighth PMOS transistor. A source of the fourth NMOS transistor is connected to a drain of the sixth NMOS transistor. A source of the eighth PMOS transistor is connected to a drain of the tenth PMOS transistor. A source of the tenth PMOS transistor is connected to a power supply voltage. Sources of the fifth NMOS transistor and the sixth NMOS transistor are grounded.

Preferably, the current-voltage conversion subunit includes a ninth PMOS transistor, an eleventh PMOS transistor, a ninth resistor, a tenth resistor, and a voltage buffer. A gate of the eleventh PMOS transistor is connected to the gate of the tenth PMOS transistor. A drain of the eleventh PMOS transistor is connected to a source of the ninth PMOS transistor. A gate of the ninth PMOS transistor is connected to the gate of the eighth PMOS transistor. A drain of the ninth PMOS transistor is connected to one end of the ninth resistor. The other end of the ninth resistor is connected to one end of the tenth resistor and a non-inverting input end of the voltage buffer. An inverting input end of the voltage buffer is connected to an output end of the voltage buffer. A source of the eleventh PMOS transistor is connected to the power supply voltage. The other end of the tenth resistor is grounded.

According to a second aspect of an embodiment of the present invention, an integrated circuit chip is provided. The integrated circuit chip includes the foregoing power measurement circuit.

According to a third aspect of an embodiment of the present invention, a communication terminal is provided. The communication terminal includes the foregoing power measurement circuit.

In the power measurement circuit provided in the present invention, during a process of the power measurement unit converting, into a direct current voltage, a received radio frequency signal to be measured, conversion accuracy is calibrated. Such that measurement sensitivity can be effectively adjusted. In addition, reference currents with different temperature coefficients are generated by using a reference current generation unit, so that measurement precision does not change with temperature within a working temperature range, thereby ensuring that a voltage ultimately output by the power measurement circuit does not change with the temperature, and implementing high measurement precision. Therefore, in the present invention, radio frequency power is measured based on a standard CMOS process, so that system costs can be effectively reduced, and high measurement precision is achieved.

DETAILED DESCRIPTION

The technical content of the present invention is further described below in detail with reference to the accompanying drawings and specific embodiments.

Figure 1:
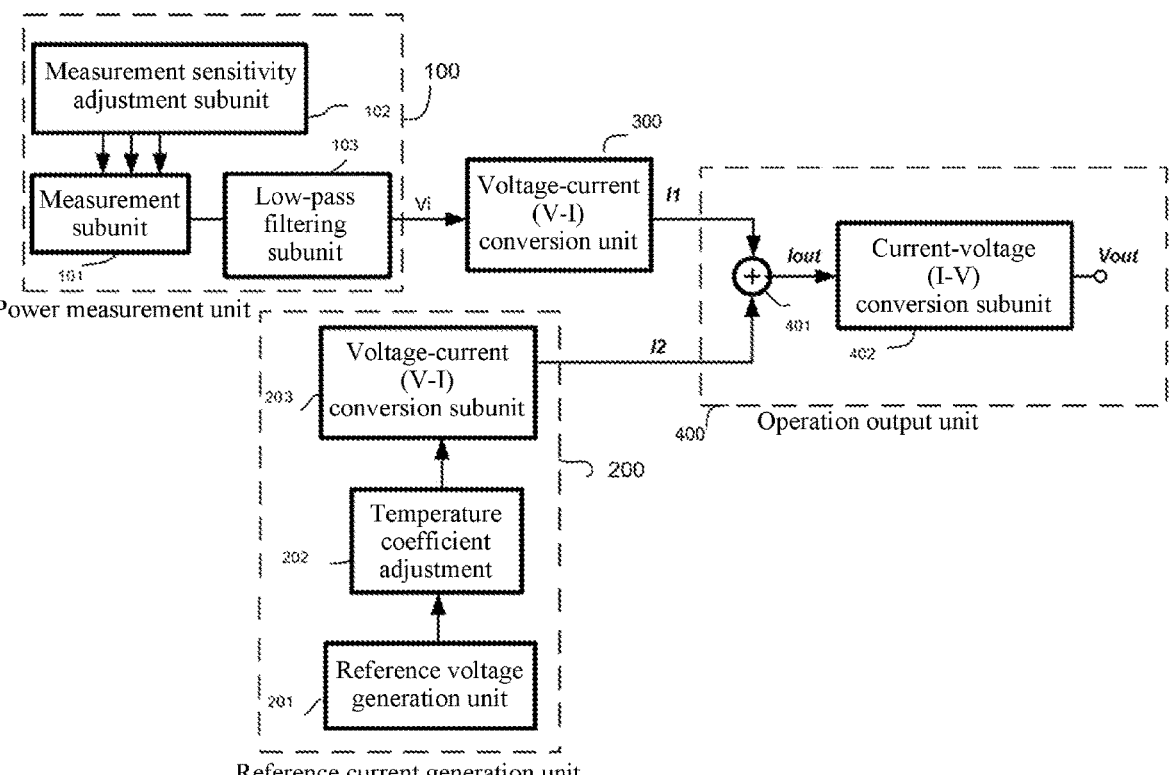
FIG. 1 is a schematic diagram of a structure of a power measurement circuit according to an embodiment of the present invention.

To resolve the problems of high costs and low measurement precision of an existing power measurement circuit for a radio frequency power amplifier, as shown in FIG. 1, an embodiment of the present invention provides a power measurement circuit, including a power measurement unit 100, a reference current generation unit 200, a voltage-current (V-I) conversion unit 300, and an operation output unit 400. An output end of the power measurement unit 100 is connected to an input end of the voltage-current conversion unit 300. An output end of the voltage-current conversion unit 300 and an output end of the reference current generation unit 200 are separately connected to an input end of the operation output unit 400.

A received radio frequency signal to be measured is sequentially calibrated and filtered by using the power measurement unit 100, to obtain a direct current voltage signal with a preset temperature coefficient and preset precision. The direct current voltage signal is output to the voltage-current conversion unit 300, to obtain a corresponding direct current. The corresponding direct current is output to the operation output unit 400. The reference current generation unit 200 generates reference currents with different temperature coefficients, selects, from the reference currents, a reference current with a same temperature coefficient as the direct current output by the power measurement unit 100, and outputs the reference current to the operation output unit 400 to perform, according to a preset ratio, a superposition operation on the reference current and the corresponding direct current, to obtain an output current irrelevant to a temperature and convert the output current into a corresponding output voltage for representing output power of the radio frequency power amplifier, so that the measurement of the output power of the radio frequency power amplifier is implemented.

As shown in FIG. 1, the power measurement unit 100 includes a measurement subunit 101, a measurement sensitivity adjustment subunit 102, and a low-pass filtering subunit 103. An input end of the measurement subunit 101 is connected to the to-be-measured radio frequency signal. An adjustment end of the measurement subunit 101 is connected to a common end of the measurement sensitivity adjustment subunit 102. An output end of the measurement subunit 101 is connected to an input end of the low-pass filtering subunit 103. An input end of the measurement sensitivity adjustment subunit 102 is connected to a bandgap reference circuit. An output end of the low-pass filtering subunit 103 is connected to the input end of the voltage-current conversion unit 300.

Figure 2:
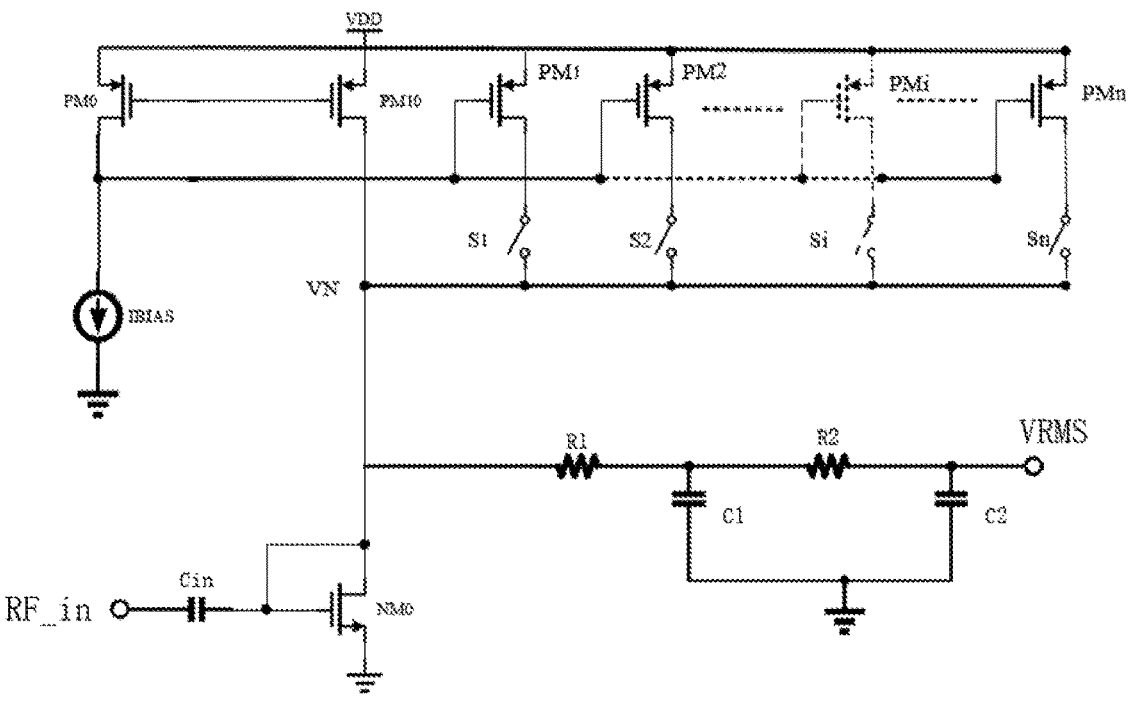
FIG. 2 is a schematic diagram of a circuit of a power measurement unit in a power measurement circuit according to an embodiment of the present invention.

Specifically, the measurement subunit 101 is configured to complete the measurement of the to-be-measured radio frequency signal and obtain a corresponding alternating current conversion voltage signal. As shown in FIG. 2, the power measurement unit 100 includes a first capacitor Cin, a first NMOS transistor NM0, and a first PMOS transistor PM10. One end of the first capacitor Cin is connected to the to-be-measured radio frequency signal, and the other end of the first capacitor Cin is connected to a gate of the first NMOS transistor NM0 that is in a form of a diode connection. The gate and a drain of the first NMOS transistor NM0 are connected to each other (which is used as the output end of the measurement subunit 101) and are connected to a drain of the first PMOS transistor PM10, the common end VN of the measurement sensitivity adjustment subunit 102, and the input end of the low-pass filtering subunit 103. A source of the first NMOS transistor NM0 is grounded.

The first capacitor Cin is an alternating current signal coupling capacitor. The to-be measured radio frequency signal is coupled to the first NMOS transistor NM0 via the first capacitor Cin, to obtain a corresponding alternating current conversion voltage signal. The first PMOS transistor PM10 is configured to provide a bias current for the first NMOS transistor NM0 to ensure a normal operation of the first NMOS transistor NM0.

Because the first NMOS transistor NM0 is affected by environmental factors during a process of converting the received radio frequency signal into a corresponding voltage signal, the obtained alternating current conversion voltage signal has a negative temperature coefficient characteristic, and the measurement sensitivity adjustment subunit 102 needs to generate a compensation voltage with a positive temperature coefficient that is configured to calibrate, based on an actual conversion voltage value corresponding to the radio frequency signal, the voltage signal with the negative temperature coefficient generated by the first NMOS transistor NM0, to obtain a voltage signal with a preset temperature coefficient. Generally, the voltage signal with the negative temperature coefficient obtained by the first NMOS transistor NM0 is calibrated to a voltage signal with a zero temperature coefficient by using the measurement sensitivity adjustment subunit 102.

As shown in FIG. 2, the measurement sensitivity adjustment subunit 102 includes a current source IBIAS, a second PMOS transistor PM0, and a plurality of third PMOS transistors (PM1 to PMn) and change-over switches (S1 to Sn). The current source IBIAS is connected to a drain and gate of the second PMOS transistor PM0 as well as gates of the third PMOS transistors. Drains of the third PMOS transistors are respectively connected to movable ends of corresponding change-over switches (to be specifically, a drain of a third PMOS transistor PM1 is connected to a movable end of a change-over switch S1, . . . , a drain of a third PMOS transistor PMn is connected to a movable end of a change-over switch Sn). Stationary ends of the change-over switches are jointly connected to a node VN between the drains of the first PMOS transistor PM10 and the first NMOS transistor NM0 to form the common end VN of the measurement sensitivity adjustment subunit 102. Sources of the second PMOS transistor PM0 and the third PMOS transistors are connected to a power supply voltage VDD.

The current source IBIAS provided by the bandgap reference circuit is used to provide a direct current for the second PMOS transistor PM0. The second PMOS transistor PM0 is in a diode connection. The second PMOS transistor PM0 and the third PMOS transistors PM1 to PMn form a current minor circuit. A conversion current signal with a positive temperature coefficient formed by the third PMOS transistors PM1 to PMn adjusts a quantity of closed change-over switches S1 to Sn based on an actual alternating current voltage value corresponding to the radio frequency signal and connects a current at which the change-over switches are located, to calibrate conversion sensitivity generated by the first NMOS transistor NM0. When different switches S1 to Sn are chosen to be turned on, different bias currents can be provided for the NMOS transistor NM0, so as to achieve different measurement sensitivity. In addition, a voltage signal with a specific temperature coefficient is generated by using the reference current generation unit, and finally subtraction is performed by the operation output unit, to eliminate influence of the temperature coefficient and obtain output with a zero temperature coefficient.

The low-pass filtering subunit 103 is configured to filter the alternating current voltage signal with the preset temperature coefficient calibrated by the measurement sensitivity adjustment subunit 102, and filter out alternating current component, to obtain a direct current voltage signal VRMS with a preset temperature coefficient. As shown in FIG. 2, the low-pass filtering subunit 103 includes a first resistor R1, a second resistor R2, a second capacitor C1, and a third capacitor C2. One end of the first resistor R1 is connected to the output end of the measurement subunit 101. The other end of the first resistor R1 is connected to one end of the second resistor R2 and one end of the second capacitor C1. The other end of the second resistor R2 is connected to one end of the third capacitor C2. The other ends of the second capacitor C1 and the third capacitor C2 are grounded. The first resistor R1 and the second capacitor C1 implement first-order filtering, and the second resistor R2 and the third capacitor C2 implement second-order filtering.

As shown in FIG. 1, the reference current generation unit 200 includes a reference voltage generation subunit 201, a voltage temperature coefficient adjustment subunit 202, and a voltage-current (V-I) conversion subunit 203. An output end of the reference voltage generation subunit 201 is connected to an input end of the voltage temperature coefficient adjustment subunit 202. An output end of the voltage temperature coefficient adjustment subunit 202 is connected to an input end of the voltage-current (V-I) conversion subunit 203. An output end of the voltage-current (V-I) conversion subunit 203 is connected to the input end of the operation output unit 400.

Figure 3:
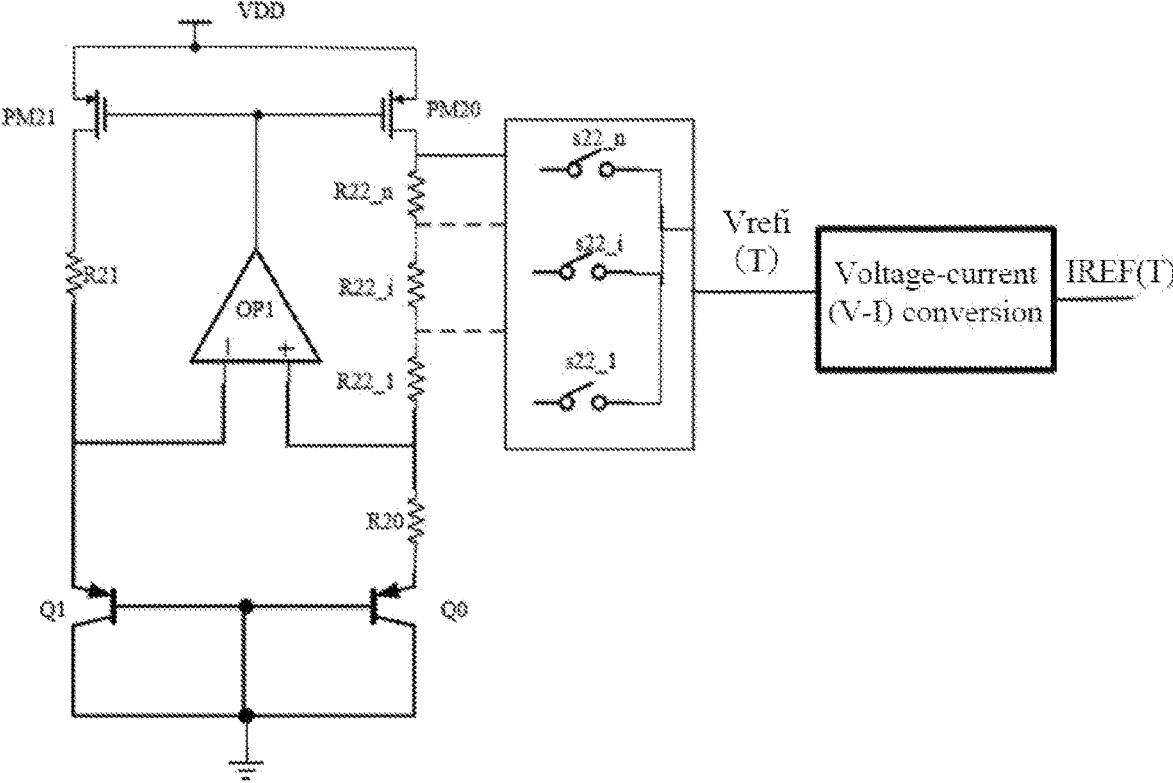
FIG. 3 is a schematic diagram of a circuit of a reference current generation unit in a power measurement circuit according to an embodiment of the present invention.

The reference voltage generation subunit 201 is configured to generate a reference voltage. As shown in FIG. 3, the reference voltage generation subunit 201 is implemented using a bandgap reference module. The bandgap reference module includes a first transistor Q1, a second transistor Q0, a first operational amplifier OP1, a third resistor R20, a fourth resistor R21, a fourth PMOS transistor PM20, and a fifth PMOS transistor PM21. An emitter of the first transistor Q1 is connected to an inverting input end of the first operational amplifier OP1 and one end of the fourth resistor R21. An emitter of the second transistor Q0 is connected to a non-inverting input end of the first operational amplifier OP1 via the third resistor R20. An output end of the first operational amplifier OP1 is connected to gates of the fourth PMOS transistor PM20 and the fifth PMOS transistor PM21. The other end of the fourth resistor R21 is connected to a drain of the fifth PMOS transistor PM21. The voltage temperature coefficient adjustment subunit 202 is provided between a drain of the fourth PMOS transistor PM20 and the non-inverting input end of the first operational amplifier OP1. Sources of the fourth PMOS transistor PM20 and the fifth PMOS transistor PM21 are connected to the power supply voltage VDD. Bases and collectors of the first transistor Q1 and the second transistor Q0 are grounded respectively. A process of generating the reference voltage by the bandgap reference module is an existing technology and is not be described herein again.

The voltage temperature coefficient adjustment subunit 202 is configured to cooperate with the reference voltage generation subunit 201 to generate reference voltages with different temperature coefficients. As shown in FIG. 3, the voltage temperature coefficient adjustment subunit 202 includes a same quantity of fifth resistors (R22_1 to R22_n) and control switches S22_1 to S22_n. The fifth resistors are sequentially connected in series, and resistance feedback nodes are respectively provided between adjacent fifth resistors as well as between a last fifth resistor and the drain of the fourth PMOS transistor PM20. The resistance feedback nodes are respectively connected to movable ends of the control switches. Stationary ends of the control switches are connected to the input end of the voltage-current (V-I) conversion subunit 203.

Each resistance feedback node corresponds to a different voltage, and each resistance feedback node correspondingly outputs different gain coefficients to achieve diversity of the gain coefficients. By controlling on and off of a corresponding control switch, a reference voltage Vrefi(T) with a determined value and a determined temperature coefficient is output to the voltage-current (V-I) conversion subunit 203. The voltage Vrefi(T) has a same temperature coefficient as the direct current voltage output by the power measurement unit 100.

The expressions of reference voltages with different temperature coefficients are shown in formula (1) and formula (2).

$$V_{refi}(T) = V_{EB}(T) + m_i * V_T * \ln N \qquad (1)$$

$$m_i = \frac{\sum_{i=1}^{i} R22\_i}{R20} \qquad (2)$$

In the foregoing equations, $V_{EB}(T)$ represents a voltage value at the non-inverting input end of the first operational amplifier OP1, $m_i$ represents a coefficient formed by a selected resistor, $V_T$ represents a thermal voltage, and is a constant, and N represents a size ratio of the second transistor Q0 to the first transistor Q1.

Figure 4:
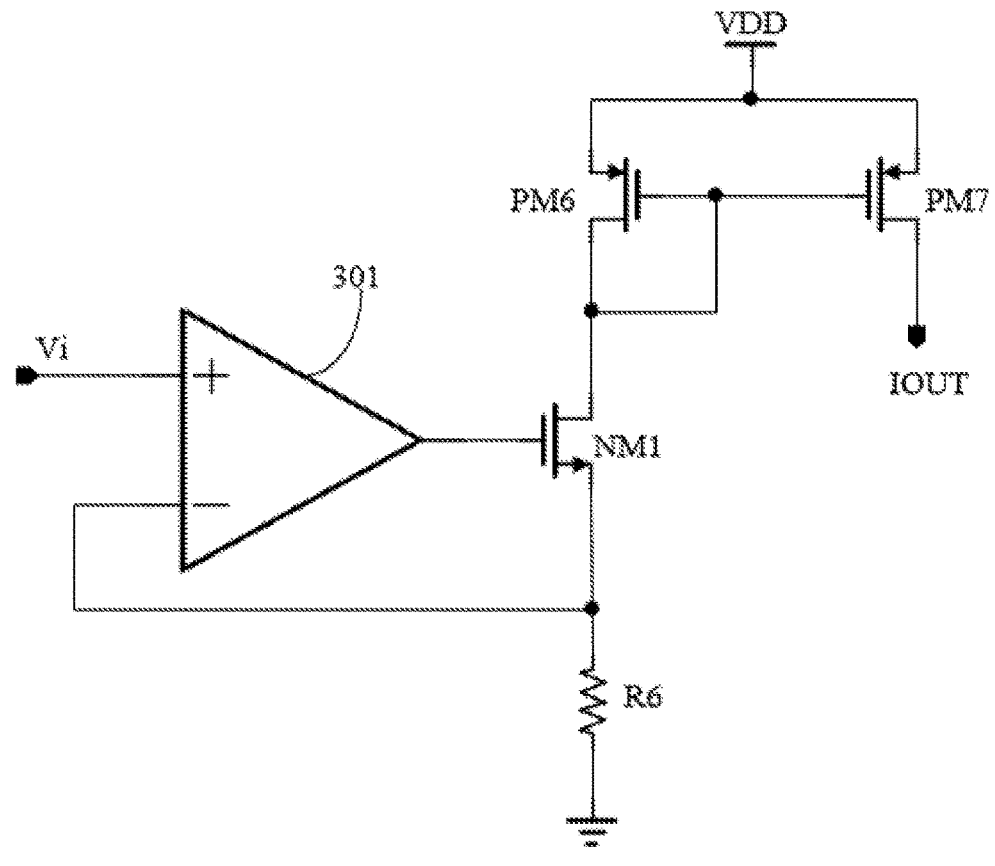
FIG. 4 is a schematic diagram of a circuit of a voltage-current (V-I) conversion unit in a power measurement circuit according to an embodiment of the present invention.

As shown in FIG. 4, the voltage-current (V-I) conversion unit 300 and the voltage-current (V-I) conversion subunit 203 have a same structure, and each include a second operational amplifier 301, a second NMOS transistor NM1, a sixth PMOS transistor PM6, a seventh PMOS transistor PM7, and a sixth resistor R6. In the voltage-current (V-I) conversion unit 300, a non-inverting input end of the second operational amplifier 301 is connected to the output end of the power measurement unit 100. In the voltage-current (V-I) conversion subunit 203, the non-inverting input end of the second operational amplifier 301 is connected to the output end of the voltage temperature coefficient adjustment subunit 202. An inverting input end of the second operational amplifier 301 is connected to one end of the sixth resistor R6 and a source of the second NMOS transistor NM1. An output end of the second operational amplifier 301 is connected to a gate of the second NMOS transistor NM1. A drain of the second NMOS transistor NM1 is connected to a drain and gate of the sixth PMOS transistor PM6 as well as a gate of the seventh PMOS transistor PM7. Sources of the sixth PMOS transistor PM6 and the seventh PMOS transistor PM7 are connected to a power supply voltage VDD. A drain of the seventh PMOS transistor PM7 is connected to the input end of the operation output unit 400.

In the voltage-current (V-I) conversion unit 300, via the second operational amplifier 301, a node voltage adjacent to the sixth resistor R6 is the direct current voltage with the preset temperature coefficient output by the power measurement unit 100. According to the following formula (3), a corresponding direct current I1 is obtained, and is output after being mirrored by the sixth PMOS transistor PM6 and the seventh PMOS transistor PM7.

In the voltage-current (V-I) conversion unit 203, via the second operational amplifier 301, a node voltage adjacent to the sixth resistor R6 is a reference voltage that is output by the voltage temperature coefficient adjustment subunit 202 and that has a same temperature coefficient as the direct current voltage output by the power measurement unit 100. According to the following formula (3), a corresponding reference current I2 is obtained, and is output after being mirrored by the sixth PMOS transistor PM6 and the seventh PMOS transistor PM7.

$$I = V_r/R_6 \qquad (3)$$

Figure 5:
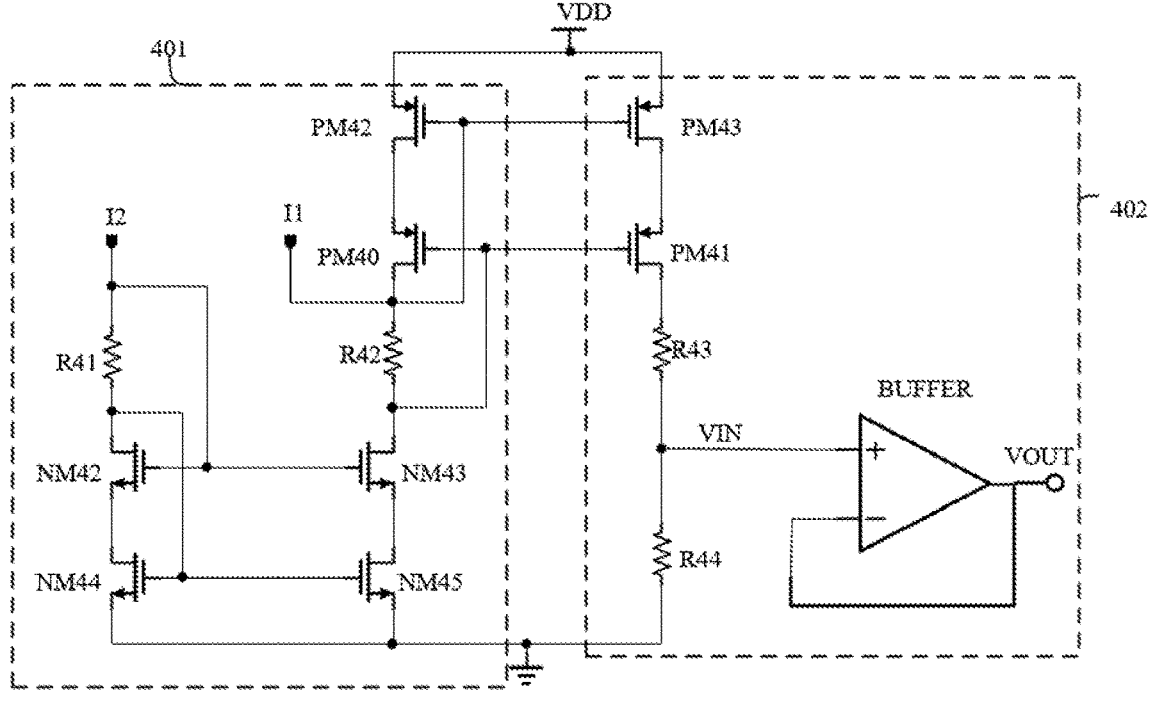
FIG. 5 is a schematic diagram of a circuit of an operation output unit in a power measurement circuit according to an embodiment of the present invention.

As shown in FIG. 5, the operation output unit 400 includes an operation subunit 401 and a current-voltage (I-V) conversion subunit 402. An input end of operation subunit 401 is connected to the output end of the voltage-current conversion unit 300 and the output end of the reference current generation unit 200. An output end of the operation subunit 401 is connected to an input end of the current-voltage conversion subunit 402.

The operation subunit 401 is configured to perform, according to a preset ratio, a superposition operation on a direct current output by the voltage-current conversion unit 300 and a reference current output by the reference current generation unit 200. As shown in FIG. 5, the operation subunit 401 includes a third NMOS transistor NM42, a fourth NMOS transistor NM43, a fifth NMOS transistor NM44, a sixth NMOS transistor NM45, an eighth PMOS transistor PM40, a tenth PMOS transistor PM42, a seventh resistor. R41, and an eighth resistor R42. One end of the seventh resistor R41 is connected to the output end of the reference current generation unit 200 and gates of the third NMOS transistor NM42 and the fourth NMOS transistor NM43. The other end of the seventh resistor R41 is connected to a drain of the third NMOS transistor NM42 and gates of the fifth NMOS transistor NM44 and the sixth NMOS transistor NM45. A source of the third NMOS transistor NM42 is connected to a drain of the fifth NMOS transistor NM44. One end of the eighth resistor R42 is connected to the output end of the voltage-current conversion unit 300, a drain of the eighth PMOS transistor PM40, and a gate of the tenth PMOS transistor PM42. The other end of the eighth resistor R42 is connected to a drain of the fourth NMOS transistor NM43 and a gate of the eighth PMOS transistor PM40. A source of the fourth NMOS transistor NM43 is connected to a drain of the sixth NMOS transistor NM45. A source of the eighth PMOS transistor PM40 is connected to a drain of the tenth PMOS transistor PM42. A source of the tenth PMOS transistor PM42 is connected to a power supply voltage VDD. Sources of the fifth NMOS transistor NM44 and the sixth NMOS transistor NM45 are grounded.

The current-voltage conversion subunit 402 is configured to convert a current that is irrelevant to a temperature and that is output by the operation subunit 401 into a corresponding output voltage. As shown in FIG. 5, the current-voltage conversion subunit 402 includes a ninth PMOS transistor PM41, an eleventh PMOS transistor PM43, a ninth resistor R43, a tenth resistor R44, and a voltage buffer BUFFER. A gate of the eleventh PMOS transistor PM43 is connected to the gate of the tenth PMOS transistor PM42. A drain of the eleventh PMOS transistor PM43 is connected to a source of the ninth PMOS transistor PM41. A gate of the ninth PMOS transistor PM41 is connected to the gate of the eighth PMOS transistor PM40. A drain of the ninth PMOS transistor PM41 is connected to one end of the ninth resistor R43. The other end of the ninth resistor R43 is connected to one end of the tenth resistor R44 and a non-inverting input end of the voltage buffer BUFFER. An inverting input end of the voltage buffer BUFFER is connected to an output end of the voltage buffer BUFFER. A source of the eleventh PMOS transistor PM43 is connected to the power supply voltage VDD. The other end of the tenth resistor R44 is grounded.

Working principles of the operation subunit 401 and the current-voltage conversion subunit 402 are as follows:

The seventh resistor R41, the third NMOS transistor NM42, and the fifth NMOS transistor NM44 form a self-bias current branch, and form an NMOS proportional current mirror circuit together with the fourth NMOS transistor NM43 and the sixth NMOS transistor NM45. A current flowing through the third NMOS transistor NM42 is equal to a current flowing through the fifth NMOS transistor NM44, and the current is a reference current I2. A current flowing through the sixth NMOS transistor NM45 is equal to a current flowing through the fourth NMOS transistor NM43, and the current is a proportional minor of the reference current I2 in the fifth NMOS transistor NM44, namely:

$$I_{DN45}=k_2{}^*I_2 \qquad (4)$$

In the foregoing formula, $k_2$ is a proportional coefficient and is determined according to an actual need.

The eighth PMOS transistor PM40, the tenth PMOS transistor PM42, and the eighth resistor R42 together form a self-bias current branch, and form a PMOS proportional current mirror circuit together with the ninth PMOS transistor PM41 and the eleventh PMOS transistor PM43. A current flowing through the eighth PMOS transistor PM40 is equal to a current flowing through the tenth PMOS transistor PM42. A current flowing through the ninth PMOS transistor PM41 is equal to a current flowing through the eleventh PMOS transistor PM43. Currents in the ninth PMOS transistor PM41 and the eleventh PMOS transistor PM43 are proportional mirror of a current in the tenth PMOS transistor PM42. Because a current flowing through the eighth resistor R42 is a sum of the current in the tenth PMOS transistor PM42 and the direct current I1, and is equal to the current in the sixth NMOS transistor NM45, the current in PM42 is:

$$I_{DP42}=I_{DN45}-I_1=k_2{}^*I_2-I_1 \qquad (5)$$

Therefore, the current in the eleventh PMOS transistor PM43 is:

$$I_{DP43}=k_1{}^*I_{DP42}=k_1{}^*(k_2{}^*I_2-I_1) \qquad (6)$$

In the foregoing formula, $K_1$ is a proportional coefficient and is determined according to an actual need.

Therefore, a voltage at an input end of the voltage buffer BUFFER is:

$$VIN=R_{44}{}^*k_1{}^*(k_2{}^*I_2-I_1) \qquad (7)$$

Ignoring a temperature coefficient of the tenth resistor R44, to obtain a voltage VIN irrelevant to a temperature, the following needs to be satisfied:

$$TC_{I1}=k_2{}^*TC_{I2} \qquad (8)$$

$TC_{I1}$ and $TC_{I2}$ are temperature coefficients of the direct current $I_1$ and the reference current $I_2$, respectively. Therefore, a temperature coefficient of the reference current output by the reference current generation unit 200 and the direct current output by the voltage-current conversion unit 300 satisfy the formula (8), so that it is detected that an output voltage does not change with temperature changes. A main function of the voltage buffer BUFFER is to improve an output driving ability of detecting the output voltage.

In addition, the power measurement circuit provided in the embodiments of the present invention can be used in an integrated circuit chip. A specific structure of the power measurement circuit in the integrated circuit chip is not described herein again.

The power measurement circuit can also be used in a communication terminal as an important component of a radio frequency integrated circuit. The communication terminal herein refers to a computer device that can be used in a mobile environment and supports various communication standards such as GSM, EDGE, TD-SCDMA, TDD-LTE, FDD-LTE, including a mobile phone, a laptop, a tablet, a vehicle-mounted computer, and the like. In addition, the technical solutions provided in the present invention are also applicable to a scenario that another radio frequency integrated circuit is used in, such as a communication base station.

In the power measurement circuit provided in the present invention, during a process of a power measurement unit converting, into a direct current voltage, a received radio frequency signal to be measured, a temperature coefficient is calibrated. Such that measurement sensitivity can be effectively adjusted. In addition, reference currents with different temperature coefficients are generated by using a reference current generation unit, so that measurement precision does not change with temperature within a working temperature range, thereby ensuring that a voltage ultimately output by the power measurement circuit does not change with the temperature, and implementing high measurement precision. Therefore, in the present invention, radio frequency power is measured based on a standard CMOS process, so that system costs can be effectively reduced, and high measurement precision is achieved.

The above provides a detailed description of the power measurement circuit, the chip, and the communication terminal provided in the present invention. For a person of ordinary skill in the art, any apparent modification made to the present invention without departing from the principle of the present invention falls within the scope of protection of the patent rights of the present invention.

What is claimed is:

1. A power measurement circuit, comprising a power measurement unit, a reference current generation unit, a voltage-current conversion unit, and an operation output unit, wherein an output end of the power measurement unit is connected to an input end of the voltage-current conversion unit, and output ends of the voltage-current conversion unit and the reference current generation unit are connected to an input end of the operation output unit; and the power measurement unit comprises a measurement subunit, a measurement sensitivity adjustment subunit, and a low-pass filtering subunit, wherein an input end of the measurement subunit is connected to the to-be-measured radio frequency signal; an adjustment end of the measurement subunit is connected to a common end of the measurement sensitivity adjustment subunit; an output end of the measurement subunit is connected to an input end of the low-pass filtering subunit; an input end of the measurement sensitivity adjustment subunit is connected to an external bandgap reference circuit; and an output end of the low-pass filtering subunit is connected to the input end of the voltage-current conversion unit; and the power measurement unit comprises a first capacitor, a first NMOS transistor, and a first PMOS transistor; one end of the first capacitor is connected to the to-be-measured radio frequency signal; the other end of the first capacitor is connected to a gate of the first NMOS transistor; the gate and a drain of the first NMOS transistor are connected to each other and are connected to a drain of the first PMOS transistor, the common end of the measurement sensitivity adjustment subunit, and the input end of the low-pass filtering subunit; and a source of the first NMOS transistor is grounded;

a received radio frequency signal to be measured is sequentially calibrated and filtered by using the power measurement unit, to obtain a direct current voltage signal with a specific temperature coefficient; the direct current voltage signal is output to the voltage-current conversion unit, to obtain a corresponding direct current; and the corresponding direct current is output to the operation output unit; and the reference current generation unit generates reference currents with different temperature coefficients, selects, from the reference currents, a reference current with a same temperature coefficient as the direct current, and outputs the reference current to the operation output unit to perform, according to a preset ratio, a superposition operation on the reference current and the corresponding direct current, to obtain an output current irrelevant to a temperature and convert the output current into a corresponding output voltage.

2. The power measurement circuit according to claim 1, wherein the measurement sensitivity adjustment subunit comprises a current source, a second PMOS transistor, and a plurality of third PMOS transistors and change-over switches; the current source is connected to a drain of the second PMOS transistor and gates of the third PMOS transistors; a gate of the second PMOS transistor is connected to a gate of the first PMOS transistor; drains of the third PMOS transistors are respectively connected to movable ends of corresponding change-over switches; stationary ends of the change-over switches are jointly connected to a node between the drains of the first PMOS transistor and the first NMOS transistor to form the common end of the measurement sensitivity adjustment subunit; and sources of the second PMOS transistor and the third PMOS transistors are connected to a power supply voltage.

3. The power measurement circuit according to claim 1, wherein the reference current generation unit comprises a reference voltage generation subunit, a voltage temperature coefficient adjustment subunit, and a voltage-current conversion subunit; an output end of the reference voltage generation subunit is connected to an input end of the voltage temperature coefficient adjustment subunit; an output end of the voltage temperature coefficient adjustment subunit is connected to an input end of the voltage-current conversion subunit; and an output end of the voltage-current conversion subunit is connected to the input end of the operation output unit.

4. The power measurement circuit according to claim 3, wherein the voltage-current conversion unit and voltage-current conversion subunit each comprise a second operational amplifier, a second NMOS transistor, a sixth PMOS transistor, a seventh PMOS transistor, and a sixth resistor; in the voltage-current conversion unit, a non-inverting input end of the second operational amplifier is connected to the output end of the power measurement unit; in the voltage-current conversion subunit, the non-inverting input end of the second operational amplifier is connected to the output end of the voltage temperature coefficient adjustment subunit; an inverting input end of the second operational amplifier is connected to one end of the sixth resistor and a source of the second NMOS transistor; an output end of the second operational amplifier is connected to a gate of the second NMOS transistor; a drain of the second NMOS transistor is connected to a drain and gate of the sixth PMOS transistor as well as a gate of the seventh PMOS transistor; sources of the sixth PMOS transistor and the seventh PMOS transistor are connected to a power supply voltage; and a drain of the seventh PMOS transistor is connected to the input end of the operation output unit.

5. The power measurement circuit according to claim 4, wherein the operation output unit comprises an operation subunit and a current-voltage conversion subunit, an input end of the operation subunit is connected to the output ends of the voltage-current conversion unit and the reference current generation unit, and an output end of the operation subunit is connected to an input end of the current-voltage conversion subunit.

6. The power measurement circuit according to claim 5, wherein the operation subunit comprises a third NMOS transistor, a fourth NMOS transistor, a fifth NMOS transistor, a sixth NMOS transistor, an eighth PMOS transistor, a tenth PMOS transistor, a seventh resistor, and an eighth resistor, wherein one end of the seventh resistor is connected to the output end of the reference current generation unit and gates of the third NMOS transistor and the fourth NMOS transistor; the other end of the seventh resistor is connected to a drain of the third NMOS transistor and gates of the fifth NMOS transistor and the sixth NMOS transistor; a source of the third NMOS transistor is connected to a drain of the fifth NMOS transistor; one end of the eighth resistor is connected to the output end of the voltage-current conversion unit, a drain of the eighth PMOS transistor, and a gate of the tenth PMOS transistor; the other end of the eighth resistor is connected to a drain of the fourth NMOS transistor and a gate of the eighth PMOS transistor; a source of the fourth NMOS transistor is connected to a drain of the sixth NMOS transistor; a source of the eighth PMOS transistor is connected to a drain of the tenth PMOS transistor; a source of the tenth PMOS transistor is connected to a power supply voltage; and sources of the fifth NMOS transistor and the sixth NMOS transistor are grounded.

7. The power measurement circuit according to claim 6, wherein the current-voltage conversion subunit comprises a ninth PMOS transistor, an eleventh PMOS transistor, a ninth resistor, a tenth resistor, and a voltage buffer, wherein a gate of the eleventh PMOS transistor is connected to the gate of the tenth PMOS transistor; a drain of the eleventh PMOS transistor is connected to a source of the ninth PMOS transistor; a gate of the ninth PMOS transistor is connected to the gate of the eighth PMOS transistor; a drain of the ninth PMOS transistor is connected to one end of the ninth resistor; the other end of the ninth resistor is connected to one end of the tenth resistor and a non-inverting input end of the voltage buffer; an inverting input end of the voltage buffer is connected to an output end of the voltage buffer; a source of the eleventh PMOS transistor is connected to the power supply voltage; and the other end of the tenth resistor is grounded.

8. An integrated circuit chip, wherein the integrated circuit chip comprises the power measurement circuit according to claim 1.

9. A communication terminal, wherein the communication terminal comprises the power measurement circuit according to claim 1.

\* \* \* \* \*